United States Patent [19]
Endo

[11] Patent Number: 5,273,807
[45] Date of Patent: Dec. 28, 1993

[54] SUBSTRATE HAVING A V-SHAPED GROOVE OF A SPECIAL CONFIGURATION IN A SUBSTRATE

[75] Inventor: Koichi Endo, Tokyo, Japan

[73] Assignee: Kabushiki Kaisha Toshiba, Kawasaki, Japan

[21] Appl. No.: 813,833

[22] Filed: Dec. 27, 1991

[30] Foreign Application Priority Data

Dec. 27, 1990 [JP] Japan .................................. 2-418762

[51] Int. Cl.⁵ .............................................. B32B 3/00
[52] U.S. Cl. .................................... 428/167; 428/156; 428/192
[58] Field of Search ............... 428/167, 156, 131, 141, 428/192, 212, 446, 901; 430/5; 156/657, 662; 437/66, 68

[56] References Cited

U.S. PATENT DOCUMENTS

3,615,149 10/1971 Malone et al. ...................... 138/151
4,663,204 5/1987 Langham ........................... 428/167

Primary Examiner—Donald J. Loney
Attorney, Agent, or Firm—Oblon, Spivak, McClelland, Maier & Neustadt

[57] ABSTRACT

A V-shaped groove having a rugged outline is formed in the substrate. A plurality of element regions in the substrate are isolated from one another by the V-shaped groove. A projection or a recess of said V-shaped groove satisfies the condition $L_n \cdot \tan\theta < W_n$ and $L_n \cdot \tan\theta < D$, where $L_n$ represents the length of a projection edge or a recessed edge of the top portion of said V shaped groove, $W_n$ represents the width of the projection or the recess, D represents the depth of the V-shaped groove, and $\theta$ represents an error between said substrate and a mask formed on said substrate to obtain said V-shaped groove. As a result, the distance between a corner of the mask and the corresponding top edge of the V-shaped groove is minimized, and the area of the element region is maximized.

5 Claims, 15 Drawing Sheets

SUBSTRATE HAVING A V-SHAPED GROOVE OF A SPECIAL CONFIGURATION IN A SUBSTRATE

BACKGROUND OF THE INVENTION

1. Field of the Invention

This invention relates to a technique of isolating element regions from one another by means of a V-shaped groove.

2. Description of the Related Art

Figure 1A:
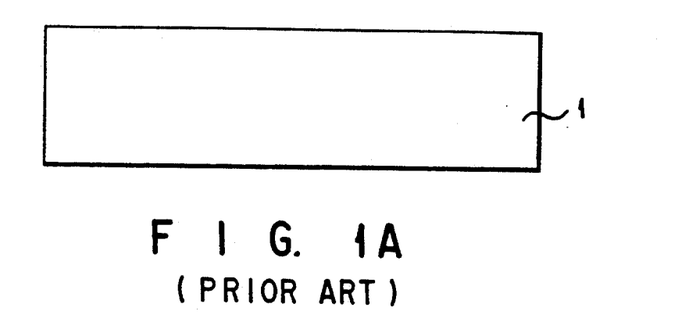
FIGS. 1A to 1G are cross-sectional views showing a conventional method of isolating element regions from each other by means of a V-shaped groove.
Figure 1B:
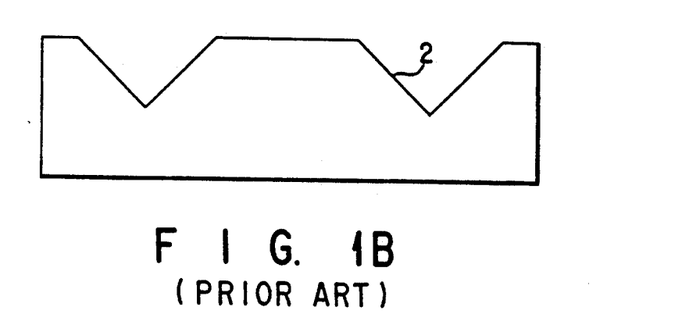
Figure 1C:
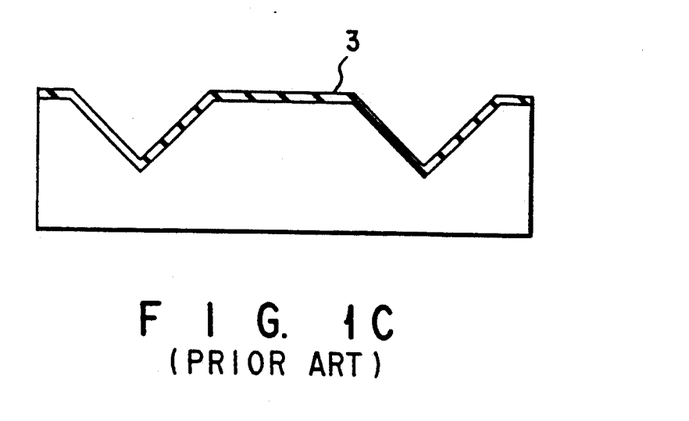
Figure 1D:
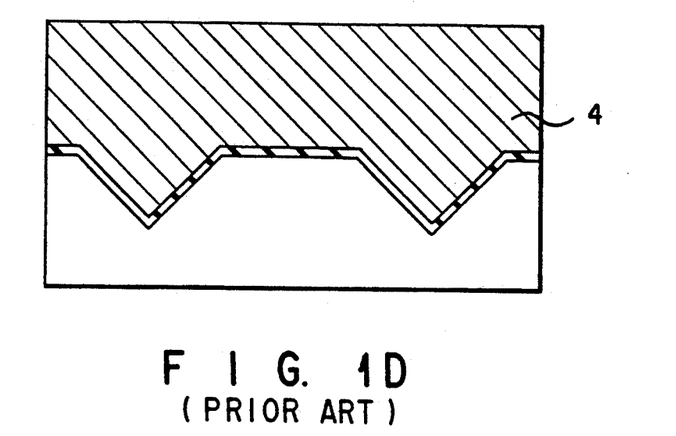
Figure 1E:
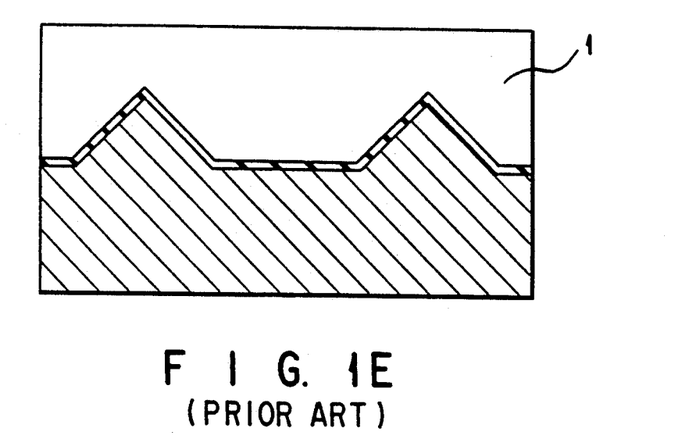
Figure 1F:
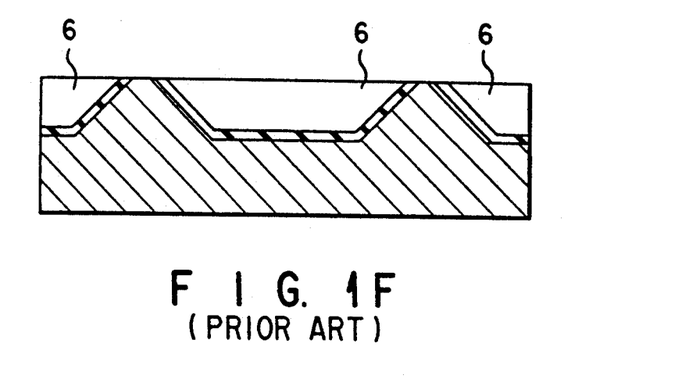
Figure 1G:
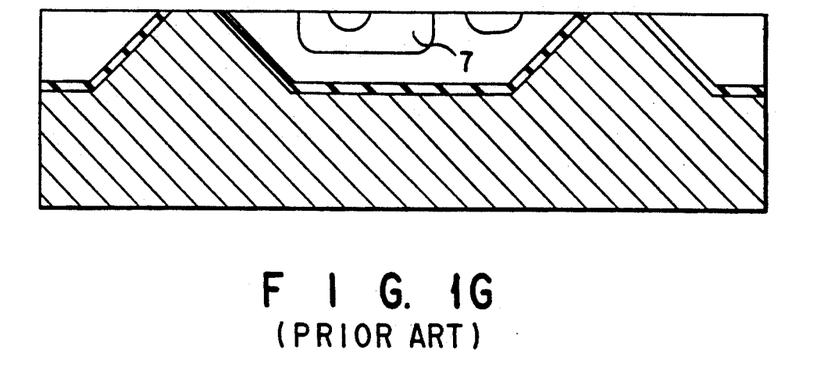

FIGS. 1A to 1G show a conventional method of isolating element regions from one another by means of a V-shaped groove. First, as shown in FIGS. 1A and 1B, a V-shaped groove 2 is formed in a monocrystalline silicon substrate 1 of a predetermined crystal orientation by an anisotropic etching method (V-shaped groove etching). Then, as shown in FIG. 1C, a thermal oxide film 3 is formed on the entire region of the surface of the substrate 1 by a thermal oxidation method. Next, as shown in FIG. 1D, a polycrystalline silicon film 4 is deposited on the thermal oxide film 3. Thereafter, as shown in FIG. 1E, the substrate 1 is reversed. Then, as shown in FIG. 1F, the substrate 1 is ground so that the bottom portion of the V-shaped groove 2 is exposed. As a result, the substrate 1 is divided into a plurality of element regions 6 isolated from one another by the V-shaped groove 2. Thereafter, as shown in FIG. 1G, an element 7 is formed in each element region 6.

Figure 2A:
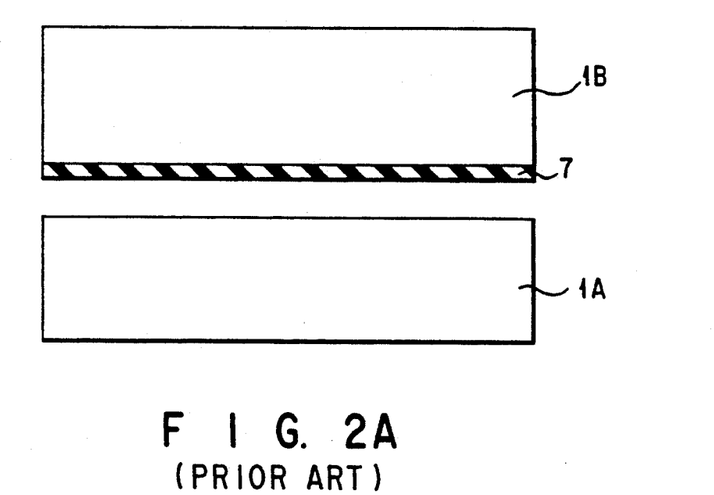
FIGS. 2A to 2H are cross-sectional views showing another conventional method of isolating element regions from each other by means of a V-shaped groove.
Figure 2B:
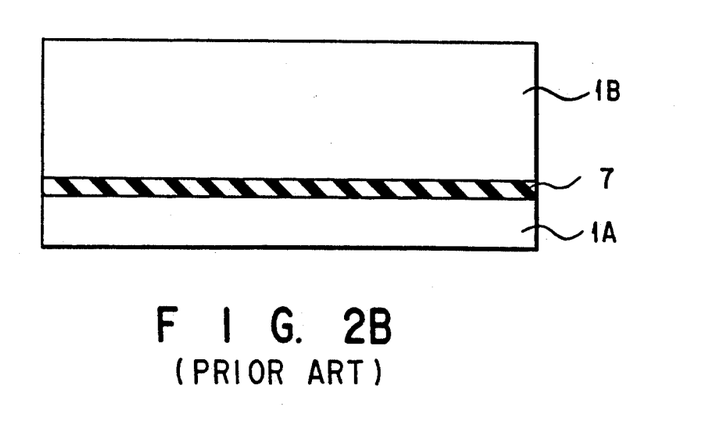
Figure 2C:
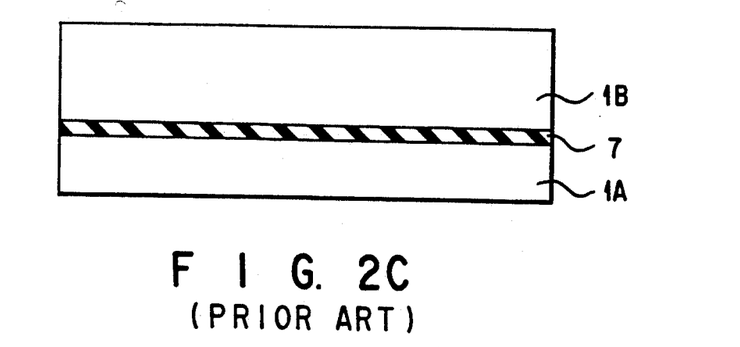
Figure 2D:
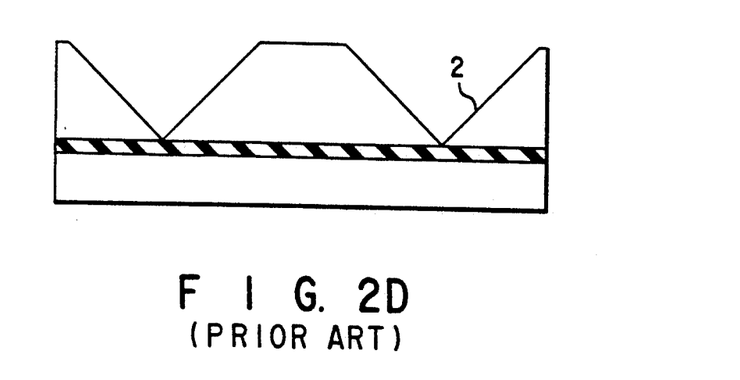
Figure 2E:
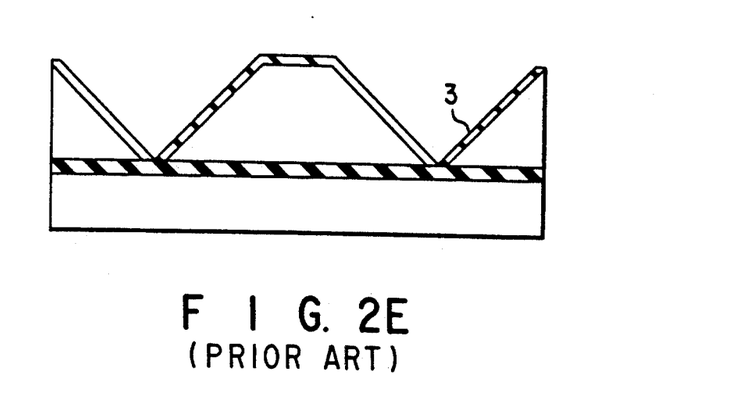
Figure 2F:
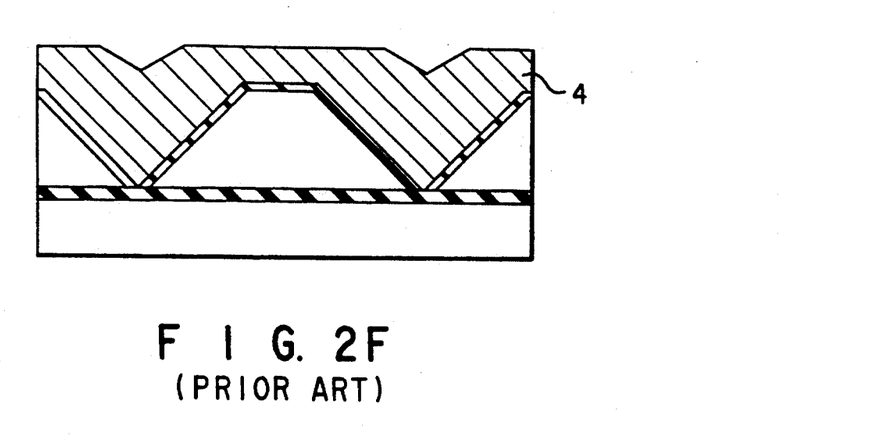
Figure 2G:
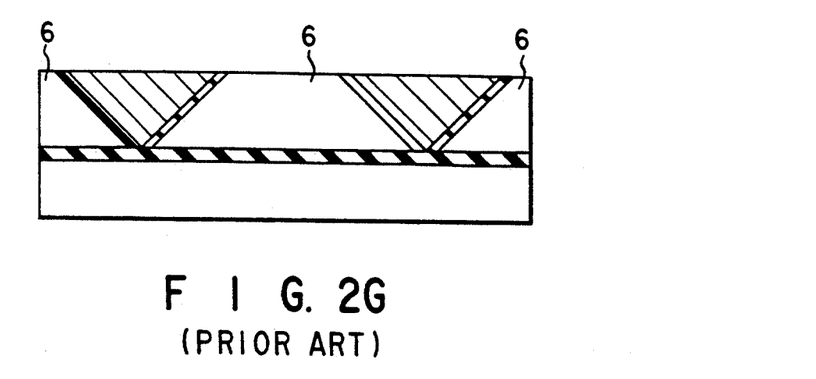
Figure 2H:
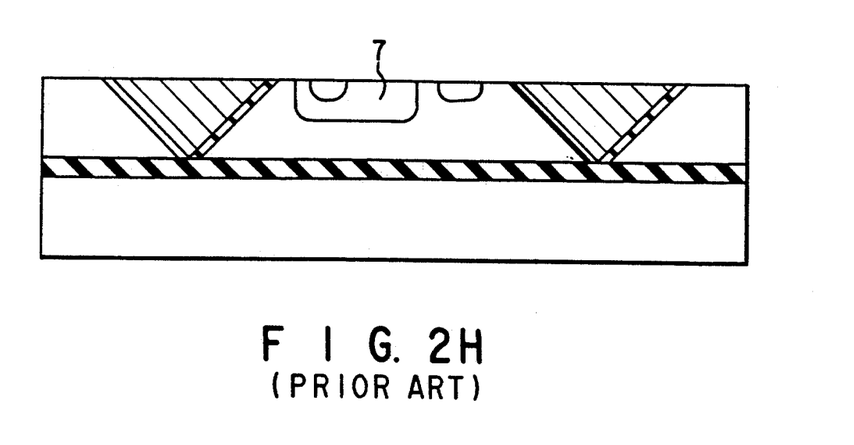

FIGS. 2A to 2H show another conventional method of isolating element regions from one another by means of a V-shaped groove. In this technique, two wafers are bonded and a V-shaped groove is formed in one of the wafers. First, as shown in FIG. 2A, a thermal oxide film 7 is formed on a monocrystalline silicon substrate 1B. Then, as shown in FIG. 2B, the monocrystalline silicon substrate 1A is bonded to the monocrystalline silicon substrate 1B (silicon wafer direct bonding process). The thermal oxide film 7 is sandwiched between the substrates 1A and 1B. Next, as shown in FIG. 2C, the substrate 1B, on which element regions are to be formed, is ground to a predetermined thickness. Thereafter, as shown in FIG. 2D, a V-shaped groove 2 is formed in the substrate 1B by an anisotropic etching method. Next, as shown in FIG. 2E, a thermal oxide film 3 is formed on the surface of the substrate 1B by a thermal oxidation method. Then, as shown in FIG. 2F, a polycrystalline silicon film 4 is formed on the thermal oxide film 3. Then, as shown in FIG. 2G, the polycrystalline silicon film 4 is ground so that the substrate 1B is exposed. As a result, the substrate 1B is divided into a plurality of element regions 6 isolated from one another by the V-shaped groove 2. Thereafter, as shown in FIG. 2H, an element 7 is formed in each element region 6.

In both of the above two methods, the V-shaped groove 2 is formed by means of an anisotropic etching method in the substrate of a predetermined crystal orientation. An alkali etching solution is used in the anisotropic etching method.

Figure 3:
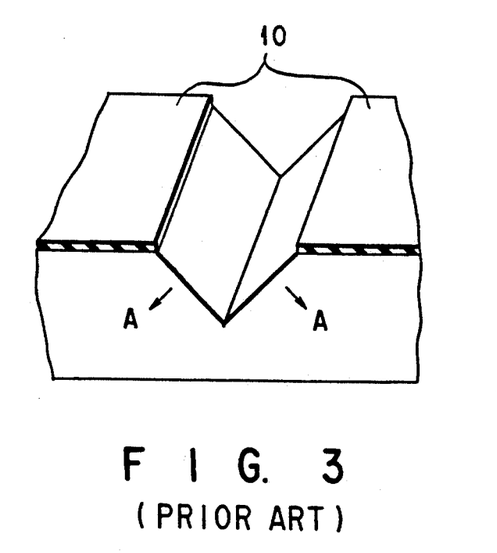
FIG. 3 is a perspective view showing a V-shaped groove formed in a substrate.

FIG. 3 is a diagram explaining a mechanism of forming a V-shaped groove in a substrate. Assuming that the surface orientation of the wafer is [100], the speed at which the wafer is etched in the direction perpendicular to the [111] plane (i.e., in the <111> direction) is much lower than those in the other directions. Thus, when the substrate 1 is etched by an anisotropic etching method, a V-shaped groove is formed in that portion which is not covered by a mask 10.

Figure 4:
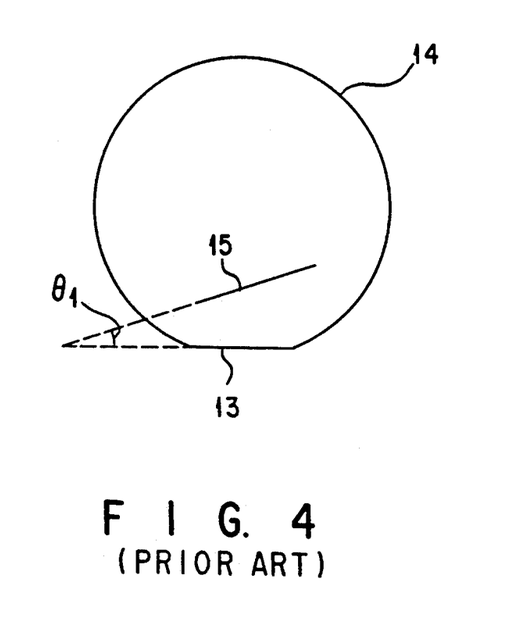
FIGS. 4 to 6 are diagrams showing errors which may occur when a V-shaped groove is formed in a substrate.
Figure 5:
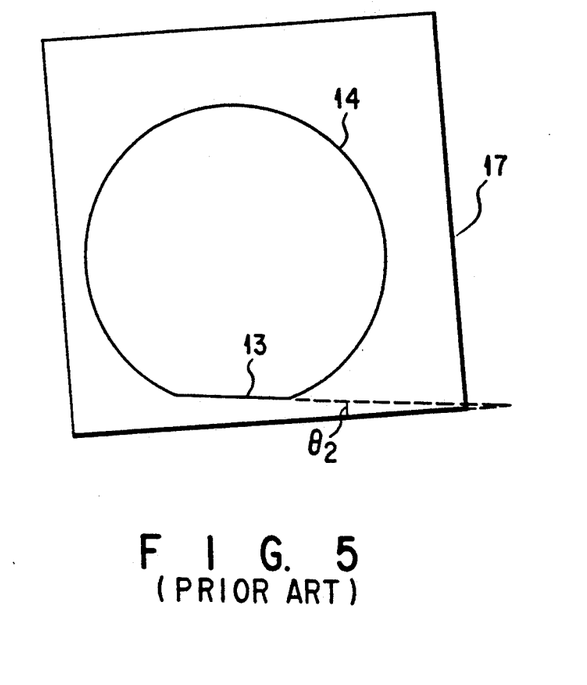
Figure 6:
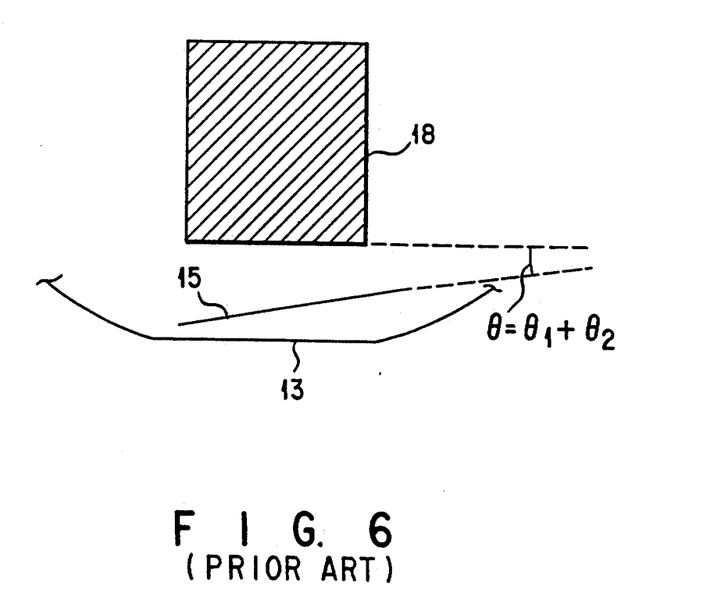
Figure 7:
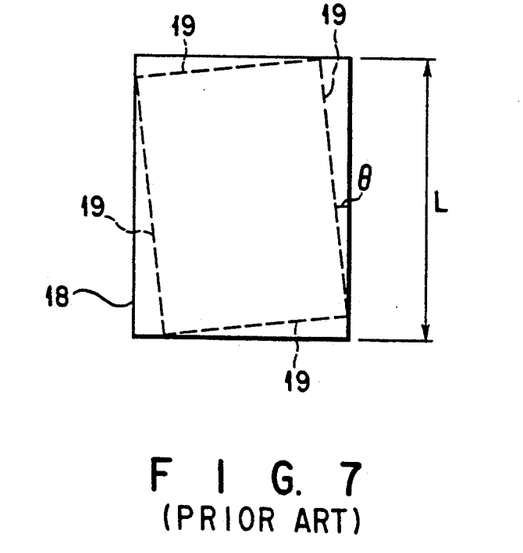
FIGS. 7 to 9 are diagrams showing states in which a V-shaped groove extends under the mask.
Figure 8:
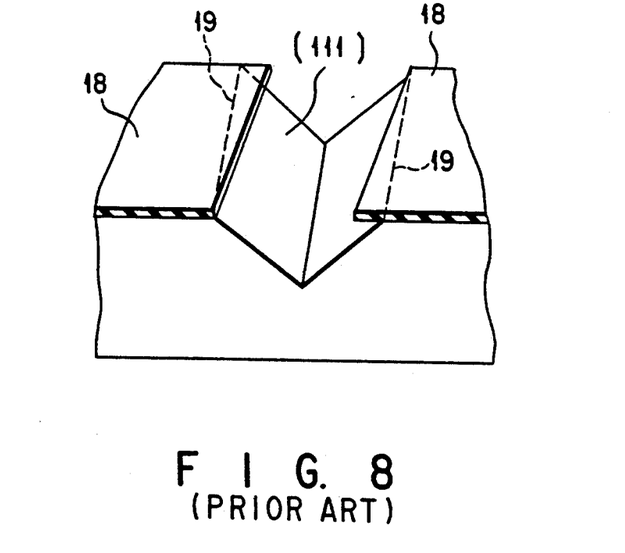
Figure 9:
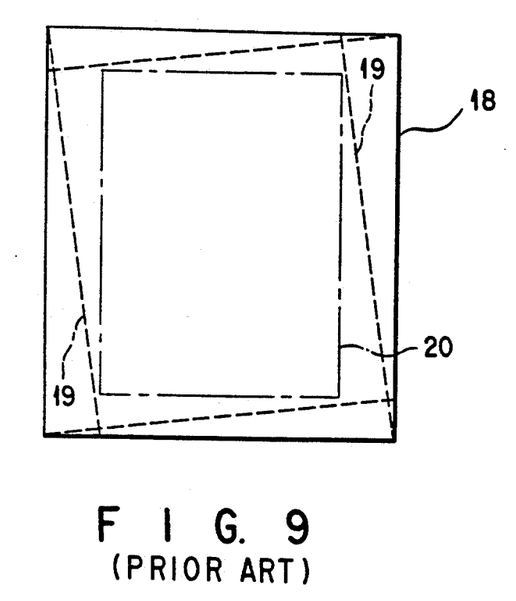

However, the anisotropic etching involves various errors. For example, as is shown in FIG. 4, an error $\theta_1$ may be produced if the orientation flat 13 does not coincide with the actual crystal orientation 15. Further, for example, as is shown in FIG. 5, an error $\theta_2$ may be produced if none of the edges of a photomask 17 for forming a mask pattern on the wafer is parallel to the orientation flat 13. If the above two errors simultaneously occur, as is shown in FIG. 6, the positional relationship between the mask pattern 18 on the wafer and the crystal orientation 15 has an error $\theta = \theta_1 + \theta_2$. As a result, a V-shaped groove 19 in the substrate 1 extends under the mask 18, as shown in FIGS. 7 and 8. The distance between a corner of the mask 18 and the corresponding top edge of the groove is at most $L \cdot \tan\theta$ (L is the length of a edge of the mask 18). For example, assuming that the length L of an edge of the mask 18 is 1000 $\mu$m and the error $\theta$ is 2°, the distance between a corner of the mask 18 and the corresponding top edge of the groove is at most $1000 \times \tan 2\pi \ (2/360) = 34 \ \mu$m.

The above conventional methods are disadvantageous in that the area of an element region is smaller than that of the mask 18 since the V-shaped groove extends under the mask 18. For example, if the mask 18 is a rectangle having sides L1 and L2, the distance between a corner of the mask and the corresponding top edge of the V-shaped groove is at most $L1 \cdot \tan\theta$ or $L2 \cdot \tan\theta$ (L represents the length of a side of the mask 18). Therefore, the element region 20 must be designed smaller than the mask region in consideration of the area of that region of the V-shaped groove which extends under the mask.

SUMMARY OF THE INVENTION

The present invention has been conceived to overcome the disadvantages of the conventional technique, and its object is to suppress the distance between a corner of the mask and the corresponding top edge of the V-shaped groove, thereby ensuring the element region at the maximum.

To achieve the object, a V-shaped groove having a rugged outline is formed in the substrate. A plurality of element regions in the substrate are isolated from one another by the V-shaped groove. A projection or a recess of the outline of said V-shaped groove satisfies the condition $L_n \cdot \tan\theta < W_n$ and $L_n \cdot \tan\theta < D$, where $L_n$ represents the length of a projecting edge or a recessed edge of the top portion of said V-shaped groove, $W_n$ represents the width of the projection or the recess, D represents the depth of the V-shaped groove, and $\theta$ represents an error between said substrate and a mask formed on said substrate to obtain said V-shaped groove. As a result, the distance between a corner of the mask and the corresponding top edge of the V-shaped groove is minimized, and the area of the element region is maximized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 10:
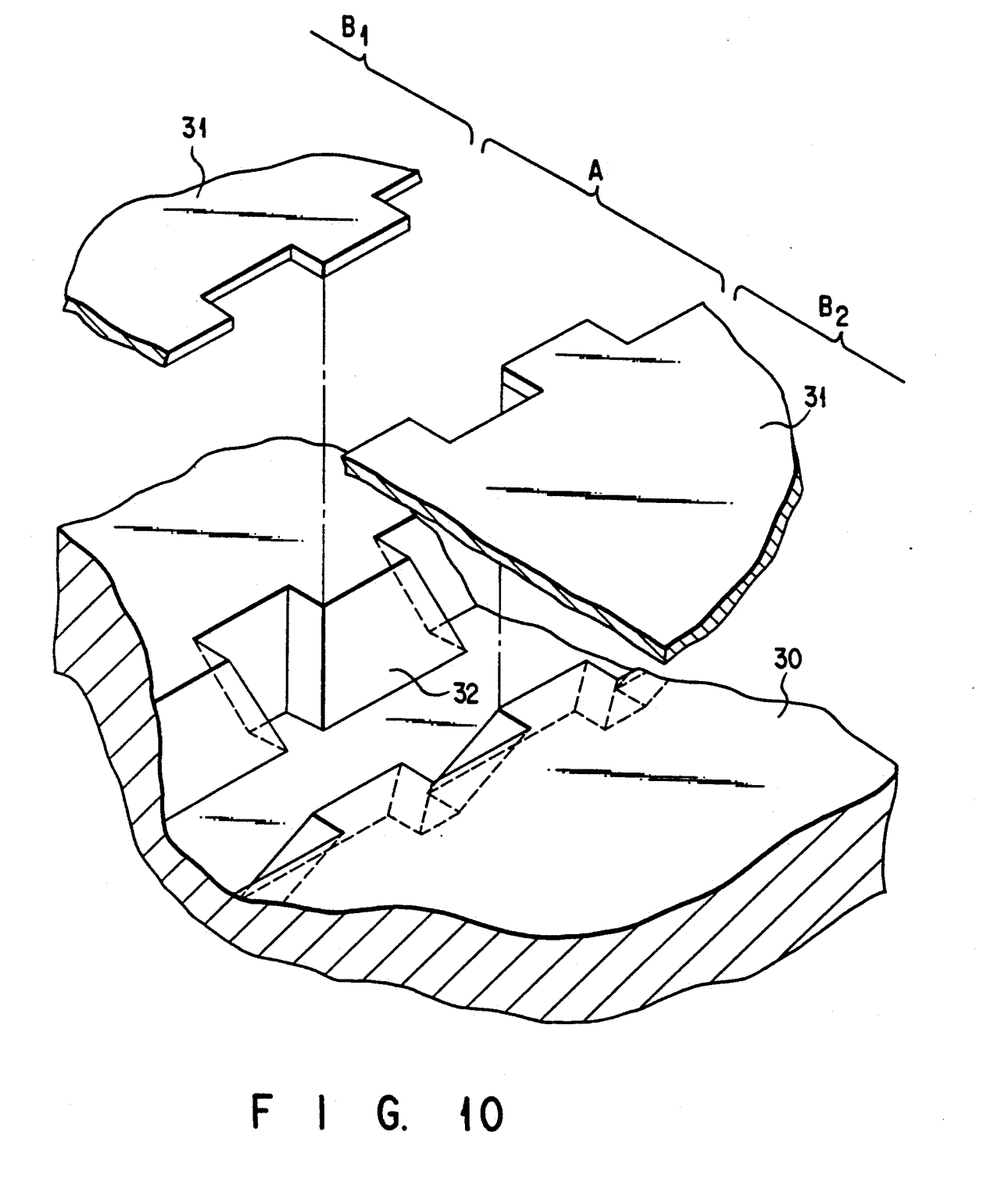
FIGS. 10 to 12 are perspective views showing a substrate having a V-shaped groove according to an embodiment of the present invention.
Figure 11:
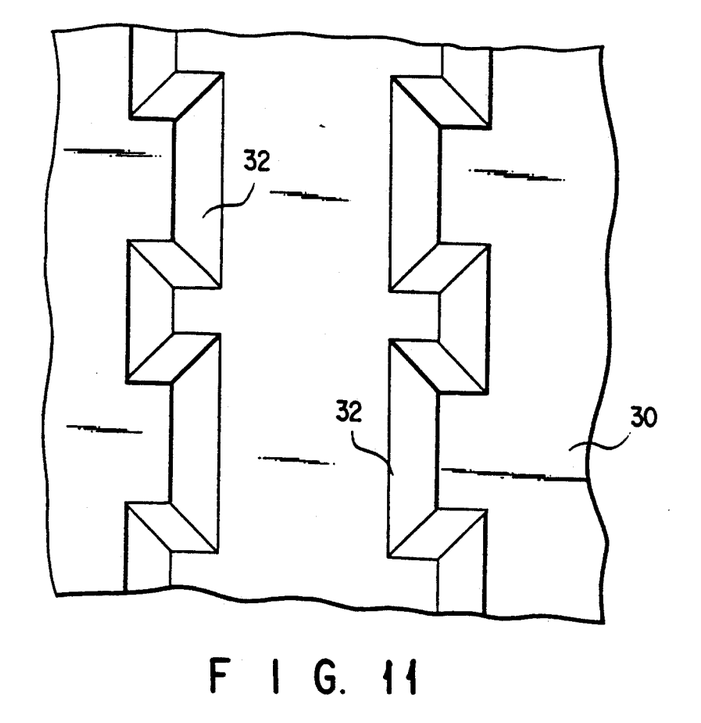
Figure 12:
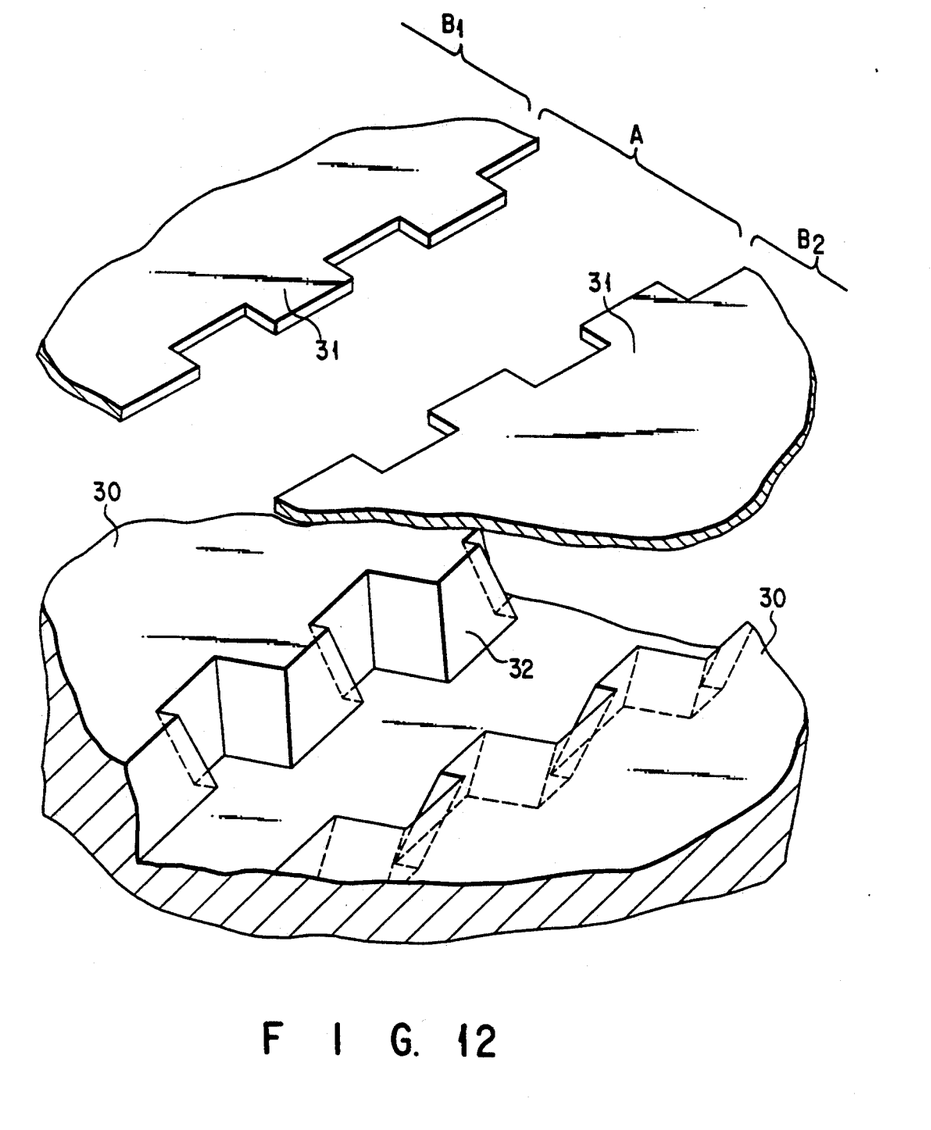

FIGS. 10 to 12 are perspective views showing a substrate having a V-shaped groove of a special configuration according to an embodiment of the present invention. In FIGS. 10 and 12, a region A is an isolating region where a V-shaped groove is formed, and regions $B_1$ and $B_2$ are element regions isolated from each other by the V-shaped groove. The substrate is characterized in that the outlines of the element regions $B_1$ and $B_2$ are rugged. FIG. 10 shows a substrate in which the error $\theta$ referred to in the description of the related art is 0. FIG. 11 is a top view of the substrate shown in FIG. 10. FIG. 12 shows a substrate in which the error $\theta$ is larger than 0.

Figure 13:
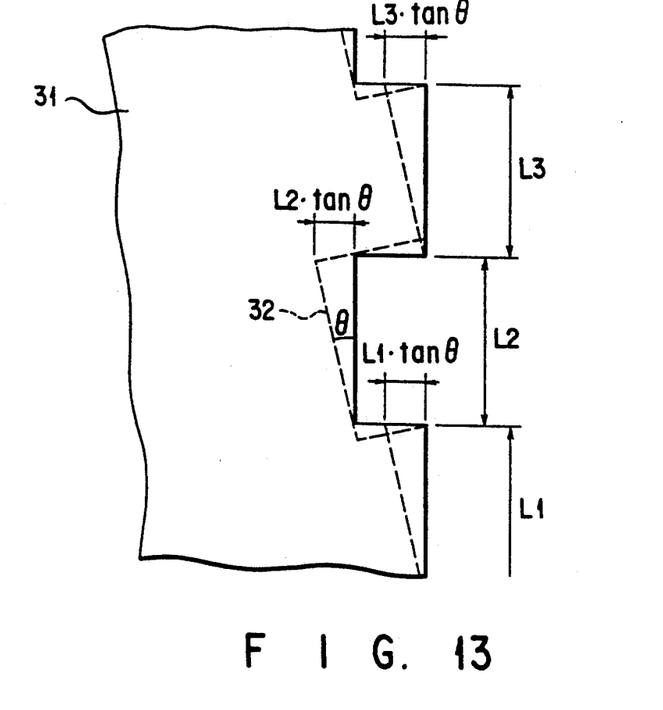
FIGS. 13 and 14A are diagrams showing the distance between a corner of the mask and the corresponding top edge of the V-shaped groove according to the present invention.

The principle of the present invention will now be described. Conventionally, the distance between a corner of the mask and the corresponding top edge of the V-shaped groove caused by an error $\theta$ is $L \cdot \tan\theta$ at the maximum, if the length of the edge of the mask including the corner is L. According to the present invention, as shown in FIG. 13, the outline of a mask 31, which is used in forming a V-shaped groove by anisotropic etching, is rugged. The lengths of a projection edge and a recessed edge of the outline of the mask are respectively represented by $L_1, L_2, \ldots$ and $L_n$.

If an error $\theta$ occurs, when the substrate is etched by an anisotropic etching method using the mask 31, the distance between a corner of a projection or a recess and the corresponding top edge of the resultant V-shaped groove is $L_1\theta\tan\theta$, $L_2\tan\theta$ or $L_n\cdot\tan\theta$ at maximum. However, the distance is much less than in the conventional art.

In other words, according to the present invention, the area of an element region formed under a mask can be more approximate to the area of the mask than in the conventional art. Moreover, if element regions are designed in accordance with the configuration of the mask 31, for example, if the element regions are rugged, the area of the element regions can be further increased.

Figure 14A:
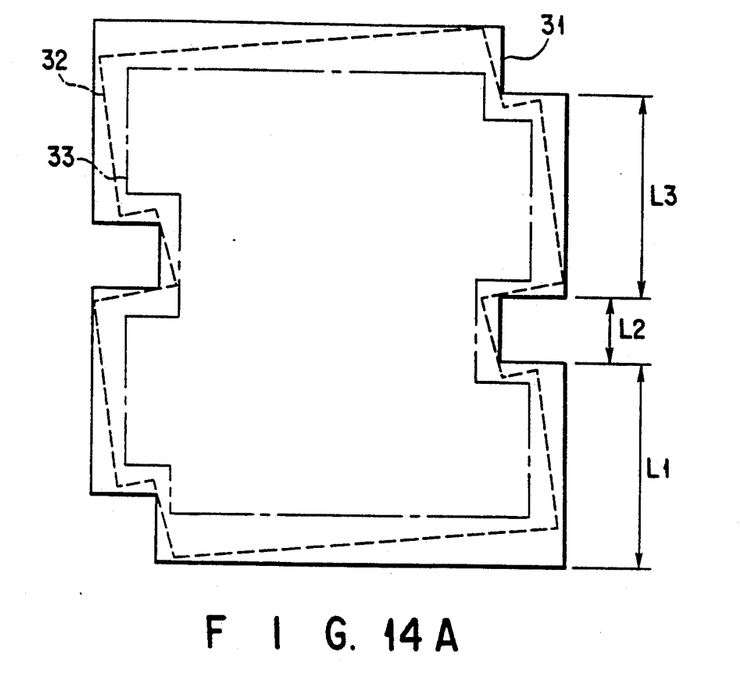
Figure 14B:
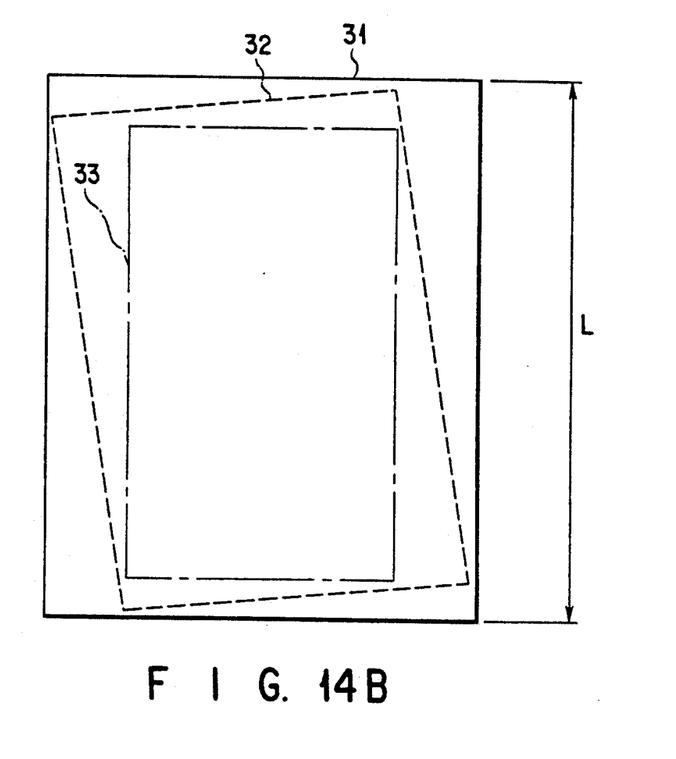
FIG. 14B is a diagram showing the distance between a corner of the mask and the corresponding top edge of the V-shaped groove according to the conventional art.

FIGS. 14A and 14B show arrangements of the element region formed under a mask, according to the present invention and the conventional art, respectively. The masks shown in both drawings have the same area. Reference numerals 31, 32, and 33 respectively denote a mask, a V-shaped groove which extends under the mask, and an element region. The area of the element region of the present invention (FIG. 14A) is more approximate to the area of the mask than in the conventional art (FIG. 14B). Accordingly, the ratio of the area of the element region 33 to the area of the mask is approximately 1. The lengths of a projection edge and a recessed edge of the mask may be the same, i.e., the lengths $L_1, L_2, \ldots$ and $L_n$ may be equal to one another.

Figure 15:
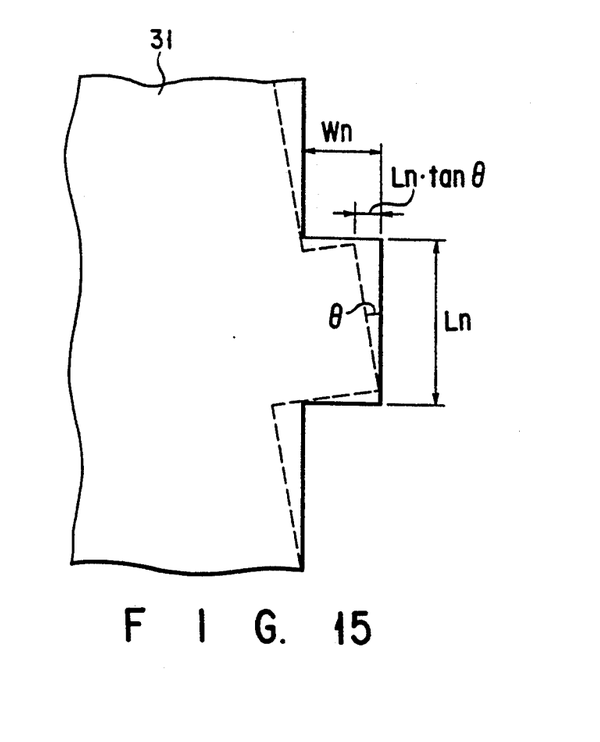
FIG. 15 is a diagram showing a relationship between the length $L_n$ and the width $W_n$ of a projection of the outline of a rugged mask according to the present invention.

If the number n of projections and recesses is increased, the area of the element region 33 can be more approximate to the area of the mask 31. However, the following conditions should be satisfied: $L_n \cdot \tan\theta < W_n$, where $L_n$ represents the length of a projection edge or a recessed edge of the mask and $W_n$ represents the width of the projection or the recess (see FIG. 15). If the above condition is not satisfied, the convexity or the concavity will be of no effect and result in the same as drawbacks of the conventional art.

As has been described above, the distance between a corner of a projection edge or a recessed edge and the corresponding top edge of the V-shaped groove is at the maximum $L_1\theta\tan\theta$, $L_2\tan\theta$ or $L_n\cdot\tan\theta$. The distance is much smaller than $L \tan\theta$ in the conventional art. Therefore, the area of an element region formed under a mask can be more approximate to the area of the mask than in the conventional art.

Figure 16:
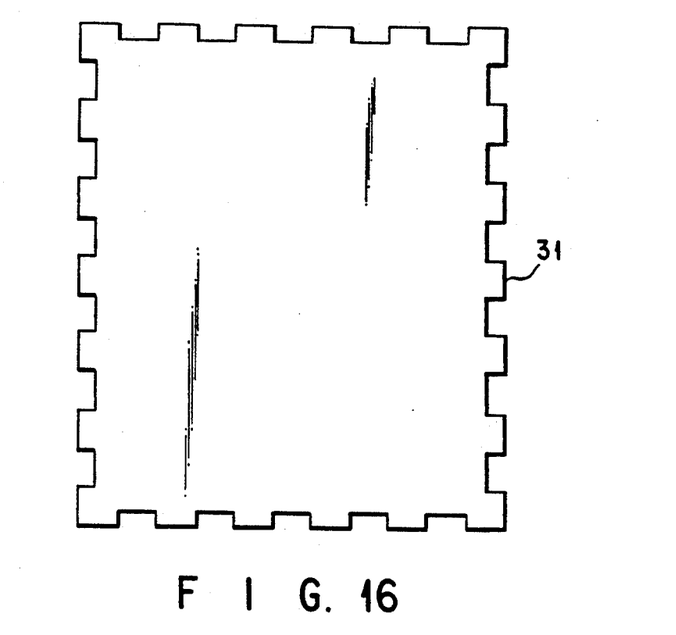
FIGS. 16 and 17 are diagrams showing a substrate having a V-shaped groove according to another embodiment of the present invention.
Figure 17:
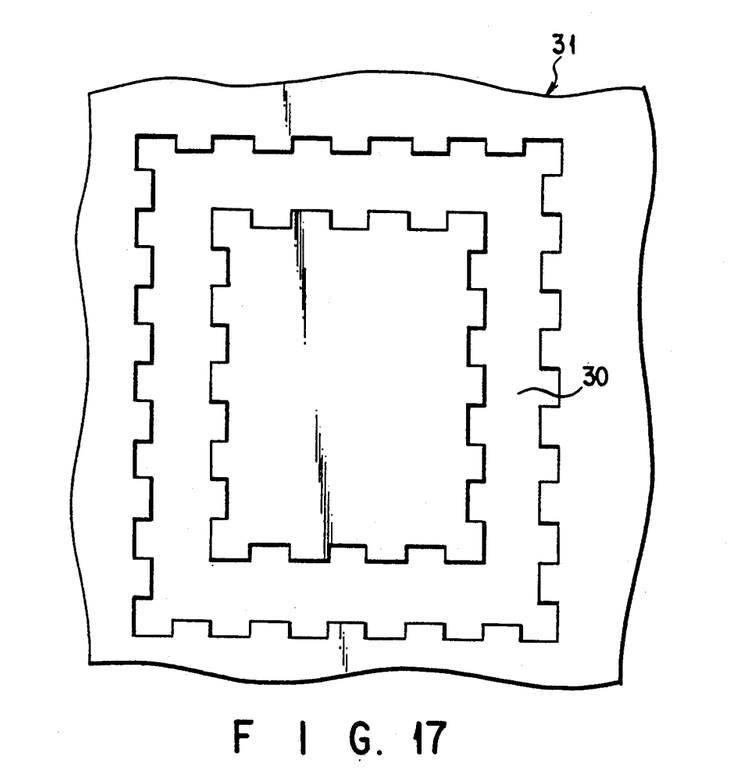

FIGS. 16 and 17 show other embodiments of the present invention. In these embodiments, the projections and recesses having the same configuration are formed on the periphery of the mask 31 at regular intervals. FIG. 17 shows a mask pattern used to form a V-shaped groove so as to surround an element region.

Figure 18:
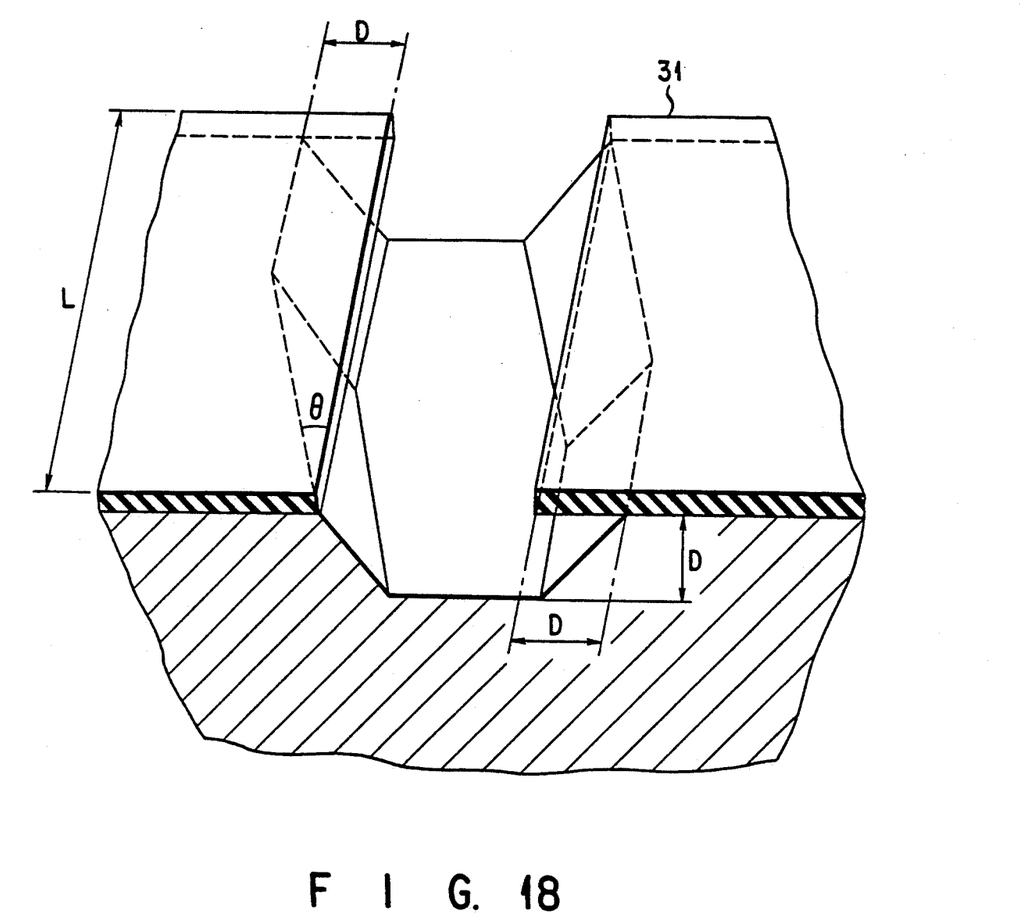
FIG. 18 is a diagram showing a relationship between the length $L_n$ of a projection of the outline of the rugged mask and the depth $D_n$ of the V-shaped groove formed under the projection of the mask.

The length L of a projection edge of a recessed edge and the depth D of a V-shaped groove has a relationship as shown in FIG. 18. The distance between the corner of the mask and the top edge of the groove never exceeds the depth D. In other words, when $L \cdot \tan\theta > D$, the above-mentioned distance is at most D. Therefore, according to the present invention, it is desirable that the length $L_n$ of a projection edge or a recessed edge and the depth D of the V-shaped groove have the following relationship:

$$L_n \cdot \tan\theta < D.$$

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor substrate comprising:
   a V-shaped groove having a rugged outline formed on a surface region of said semiconductor substrate; and
   a plurality of element regions isolated from one another by said V-shaped groove.

2. A substrate according to claim 1, wherein the configuration of a projection or a recess of a mask formed on said semiconductor substrate to obtain said V-shaped groove satisfies the condition $L_n \cdot \tan \theta < W_n$, where $L_n$ represents the length of a projecting edge or a recessed edge of the top portion of said mask, $W_n$ represents the width of the projection or the recess, and $\theta$ represents an error angle between said semiconductor substrate and said mask.

3. A substrate according to claim 1, wherein the configuration of a projection or a recess of a mask formed on said semiconductor substrate to obtain said V-shaped groove satisfies the condition $L_n \cdot \tan \theta < D$, where $L_n$ represents the length of a projecting edge or a recessed edge of the top portion of said mask, D represents the depth of said V-shaped groove, and $\theta$ represents an error angle between said semiconductor substrate and said mask.

4. A substrate according to claim 1, wherein the rugged outline of said V-shaped groove is obtained with a mask having a plurality of projecting edges each of the same length and a plurality of recessed edges each of the same length.

5. A substrate according to claim 1, wherein the substrate is a silicon wafer having a surface direction.

* * * * *